(12) United States Patent
Saito et al.

(10) Patent No.: US 12,324,187 B2
(45) Date of Patent: Jun. 3, 2025

(54) SWITCHING ELEMENT

(71) Applicant: DENSO CORPORATION, Kariya (JP)

(72) Inventors: Jun Saito, Toyota (JP); Keita Kataoka, Nagakute (JP); Yusuke Yamashita, Nagakute (JP); Yukihiko Watanabe, Nagakute (JP); Katsuhiro Kutsuki, Nagakute (JP); Yasushi Urakami, Kariya (JP)

(73) Assignee: DENSO CORPORATION, Kariya (JP)

( * ) Notice: Subject to any disclaimer, the term of this patent is extended or adjusted under 35 U.S.C. 154(b) by 481 days.

(21) Appl. No.: 17/715,381

(22) Filed: Apr. 7, 2022

(65) Prior Publication Data

US 2022/0231164 A1 Jul. 21, 2022

Related U.S. Application Data

(63) Continuation of application No. PCT/JP2019/040303, filed on Oct. 11, 2019.

(51) Int. Cl.
*H10D 30/66* (2025.01)
*H10D 62/10* (2025.01)
*H10D 62/17* (2025.01)

(52) U.S. Cl.
CPC ......... *H10D 30/668* (2025.01); *H10D 62/107* (2025.01); *H10D 62/314* (2025.01)

(58) Field of Classification Search
CPC ............. H01L 29/7813; H01L 29/0623; H01L 29/105; H01L 29/1095; H01L 29/1608; H01L 29/0696
See application file for complete search history.

(56) References Cited

U.S. PATENT DOCUMENTS

2009/0166730 A1 7/2009 Okuno et al.
2018/0247999 A1* 8/2018 Arauchi ................ H01L 29/063

* cited by examiner

*Primary Examiner* — Kretelia Graham
*Assistant Examiner* — Jaesun Lee
(74) *Attorney, Agent, or Firm* — Posz Law Group, PLC

(57) ABSTRACT

A switching element includes a semiconductor substrate having: an n-type drift region in contact with each of gate insulating films on a bottom surface and side surfaces of each of the trenches; a p-type body region in contact with the gate insulating films on the side surfaces of each of the trenches at a position above the n-type drift region; an n-type source region in contact with the gate insulating films on the side surfaces of each of the trenches at a position above the p-type body region, the n-type source region being separated away from the n-type drift region by the p-type body region; plurality of p-type bottom regions each of which is located under a corresponding one of the trenches and located away from a corresponding one of the gate insulating films; and a p-type connection region that connects the p-type bottom regions and the p-type body region.

3 Claims, 9 Drawing Sheets

COMPARATIVE EXAMPLE

SWITCHING ELEMENT

CROSS REFERENCE TO RELATED APPLICATION

This application is a continuation application of International Patent Application No. PCT/JP2019/040303 filed on Oct. 11, 2019, which designated the U.S, and the entire disclosure of all of the above application is incorporated herein by reference.

TECHNICAL FIELD

The present disclosure relates to a switching element.

BACKGROUND

A trench gate type switching element has been known. Such a switching element has a p-type bottom region (a bottom p-type layer) at a position under the trench and away from the gate insulating film. The bottom region is surrounded by an n-type drift region. When this switching element is turned off, a depletion layer expands from the body region and the bottom region into the drift region. Accordingly, concentration of the electric field on a region near the lower end of the trench can be prevented by the depletion layer extending from the bottom region.

SUMMARY

According to one aspect of the present disclosure, a switching element includes: a semiconductor substrate; a plurality of trenches provided on an upper surface of the semiconductor substrate; a plurality of gate insulating films each of which covers an inner surface of a corresponding one of the plurality of trenches; and a plurality of gate electrodes each of which is disposed inside a corresponding one of the plurality of trenches, each of the plurality of gate electrodes being insulated from the semiconductor substrate by a corresponding one of the plurality of gate insulating films. The semiconductor substrate includes: an n-type drift region in contact with each of the plurality of gate insulating films on a bottom surface and side surfaces of each of the plurality of trenches; a p-type body region in contact with the plurality of gate insulating films on the side surfaces of each of the plurality of trenches at a position above the n-type drift region; an n-type source region in contact with the plurality of gate insulating films on the side surfaces of each of the plurality of trenches at a position above the p-type body region, the n-type source region being separated away from the n-type drift region by the p-type body region; a plurality of p-type bottom regions each of which is located under a corresponding one of the plurality of trenches and located away from a corresponding one of the plurality of gate insulating films; and a p-type connection region that connects the plurality of p-type bottom regions and the p-type body region. A distance between a lower end of each of the plurality of trenches and the p-type body region is defined as a distance L1. A concentration of n-type impurities in the n-type drift region in a range between the lower end of each of the plurality of trenches and the p-type body region is defined as a concentration N1. A distance between the lower end of each of the plurality of trenches and an upper end of each of the plurality of p-type bottom regions is defined as a distance L2. A concentration of n-type impurities in the n-type drift region in a range between the lower end of each of the plurality of trenches and the upper end of each of the plurality of p-type bottom regions is defined as a concentration N2. A distance between adjacent ones of the plurality of p-type bottom regions is defined as a distance L3. A concentration of n-type impurities in the n-type drift region in a range between the adjacent ones of the plurality of p-type bottom regions is defined as a concentration N3. The following formulas 1 and 2 are satisfied.

$$L1\sqrt{N1} < \frac{L3}{2}\sqrt{N3} \quad \text{(Formula 1)}$$

$$L2\sqrt{N2} < \frac{L3}{2}\sqrt{N3} \quad \text{(Formula 2)}$$

DESCRIPTION OF EMBODIMENTS

To begin with, a relevant technology will be described first only for understanding the following embodiments.

Figure 9:
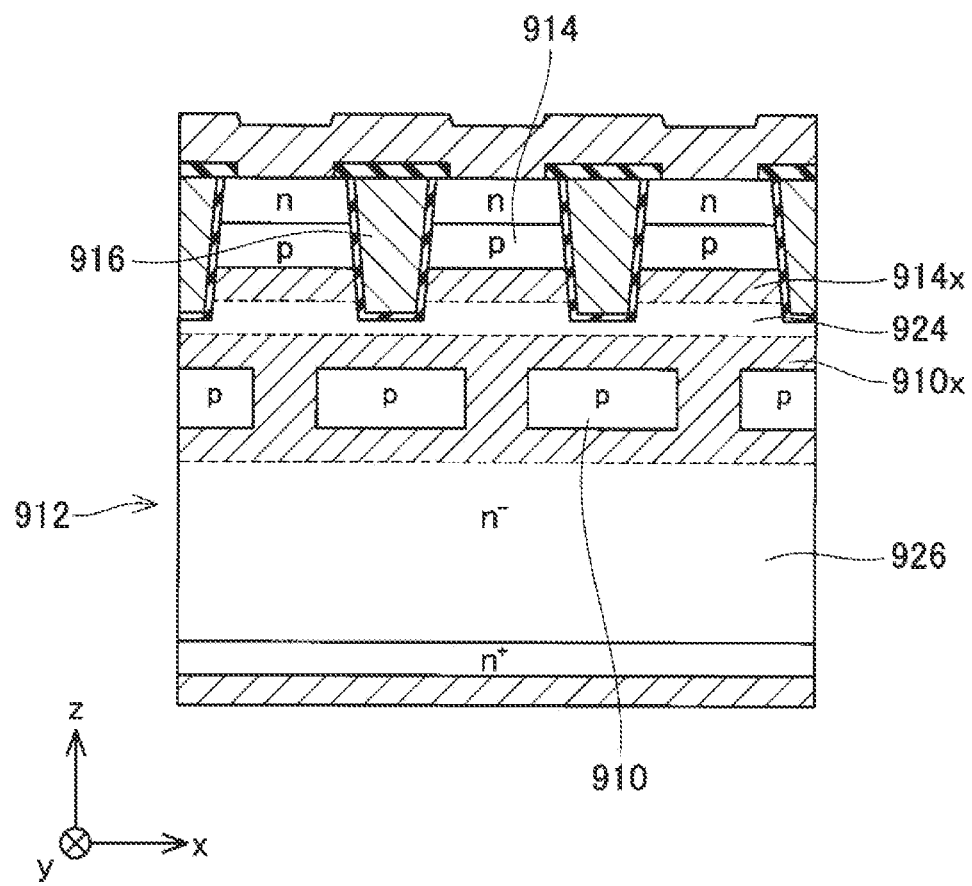
FIG. 9 is a cross-sectional view showing distribution of the depletion layer when a non-depleted region in a floating state remains according to a comparative example.

FIG. 9 shows the result of simulating the distribution of the depletion layer during the process of switching the switching element having the bottom region from an on-state to an off-state. The switching element of FIG. 9 has bottom regions 910, a drift region 912, a body region 914, and gate electrodes 916 disposed inside the trench. In FIG. 9, the reference 910x indicates a depletion layer extending from each bottom region 910 into the drift region 912. The depletion layers extending from the bottom regions 910 are connected to each other to form a layered depletion layer 910x. The reference number 914x indicates a depletion layer extending from the body region 914 into the drift region 912. The reference numbers 924 and 926 indicate regions that are not depleted (hereinafter, referred to as a "non-depleted region") in the drift region 912. As shown in FIG. 9, when the depletion layers extending from the bottom regions 910 are connected to each other without being connected to the depletion layer 914x extending from the body region 914 and forms the layered depletion layer 910x, the non-depletion region 924 remains between the depletion layer 910x and the depletion layer 914x. In this state, since the non-depleted region 924 is separated away from the non-depleted region 926, the potential of the non-depleted region 924 becomes a floating potential. In this case, the non-depleted region 924 is less likely to be depleted, and the non-depleted region 924 remains until voltage applied to the switching element increases. In this way, when the non-depleted region 924 remains in a range in contact with the trenches, a high electric field is likely to be applied to the gate insulating films, and the gate insulating films are likely to deteriorate. In the present disclosure, a structure of a switching element in which a non-depleted region in a floating state is unlikely to remain in the drift region is proposed.

As described above, according to the one aspect of the present disclosure, a switching element includes: a semiconductor substrate; a plurality of trenches provided on an upper surface of the semiconductor substrate; a plurality of gate insulating films each of which covers an inner surface of a corresponding one of the plurality of trenches; and a plurality of gate electrodes each of which is disposed inside a corresponding one of the plurality of trenches, each of the plurality of gate electrodes being insulated from the semiconductor substrate by a corresponding one of the plurality of gate insulating films. The semiconductor substrate includes: an n-type drift region in contact with each of the plurality of gate insulating films on a bottom surface and side surfaces of each of the plurality of trenches; a p-type body region in contact with the plurality of gate insulating films on the side surfaces of each of the plurality of trenches at a position above the n-type drift region; an n-type source region in contact with the plurality of gate insulating films on the side surfaces of each of the plurality of trenches at a position above the p-type body region, the n-type source region being separated away from the n-type drift region by the p-type body region; a plurality of p-type bottom regions each of which is located under a corresponding one of the plurality of trenches and located away from a corresponding one of the plurality of gate insulating films; and a p-type connection region that connects the plurality of p-type bottom regions and the p-type body region. A distance between a lower end of each of the plurality of trenches and the p-type body region is defined as a distance L1. A concentration of n-type impurities in the n-type drift region in a range between the lower end of each of the plurality of trenches and the p-type body region is defined as a concentration N1. A distance between the lower end of each of the plurality of trenches and an upper end of each of the plurality of p-type bottom regions is defined as a distance L2. A concentration of n-type impurities in the n-type drift region in a range between the lower end of each of the plurality of trenches and the upper end of each of the plurality of p-type bottom regions is defined as a concentration N2. A distance between adjacent ones of the plurality of p-type bottom regions is defined as a distance L3. A concentration of n-type impurities in the n-type drift region in a range between the adjacent ones of the plurality of p-type bottom regions is defined as a concentration N3. The following formulas 1 and 2 are satisfied.

$$L1\sqrt{N1} < \frac{L3}{2}\sqrt{N3} \qquad \text{(Formula 1)}$$

$$L2\sqrt{N2} < \frac{L3}{2}\sqrt{N3} \qquad \text{(Formula 2)}$$

By satisfying the formulas 1 and 2, when the switching element is turned off, the depletion layer extending from the body region and the depletion layer extending from each bottom region can be connected to each other before the depletion layers extending from the bottom regions are connected to each other. Therefore, it is possible to prevent the non-depleted region in a floating state from remaining in the drift region. Thus, in this switching element, the gate insulating films are unlikely to deteriorate.

The additional features of a configuration disclosed herein are listed below. Each feature listed below is useful independently.

In one example of a switching element disclosed in the present disclosure, the relationship of the following formula 3 may be satisfied.

$$L2\sqrt{N2} < L1\sqrt{N1} \qquad \text{(Formula 3)}$$

By satisfying the formula 3, the loss caused by the switching element can be reduced.

In one example of a switching element disclosed in the present disclosure, the relationship of N2<N1 may be satisfied.

By satisfying the relationship of N2<N1, the loss caused by the switching element can be reduced.

First Embodiment

Figure 1:
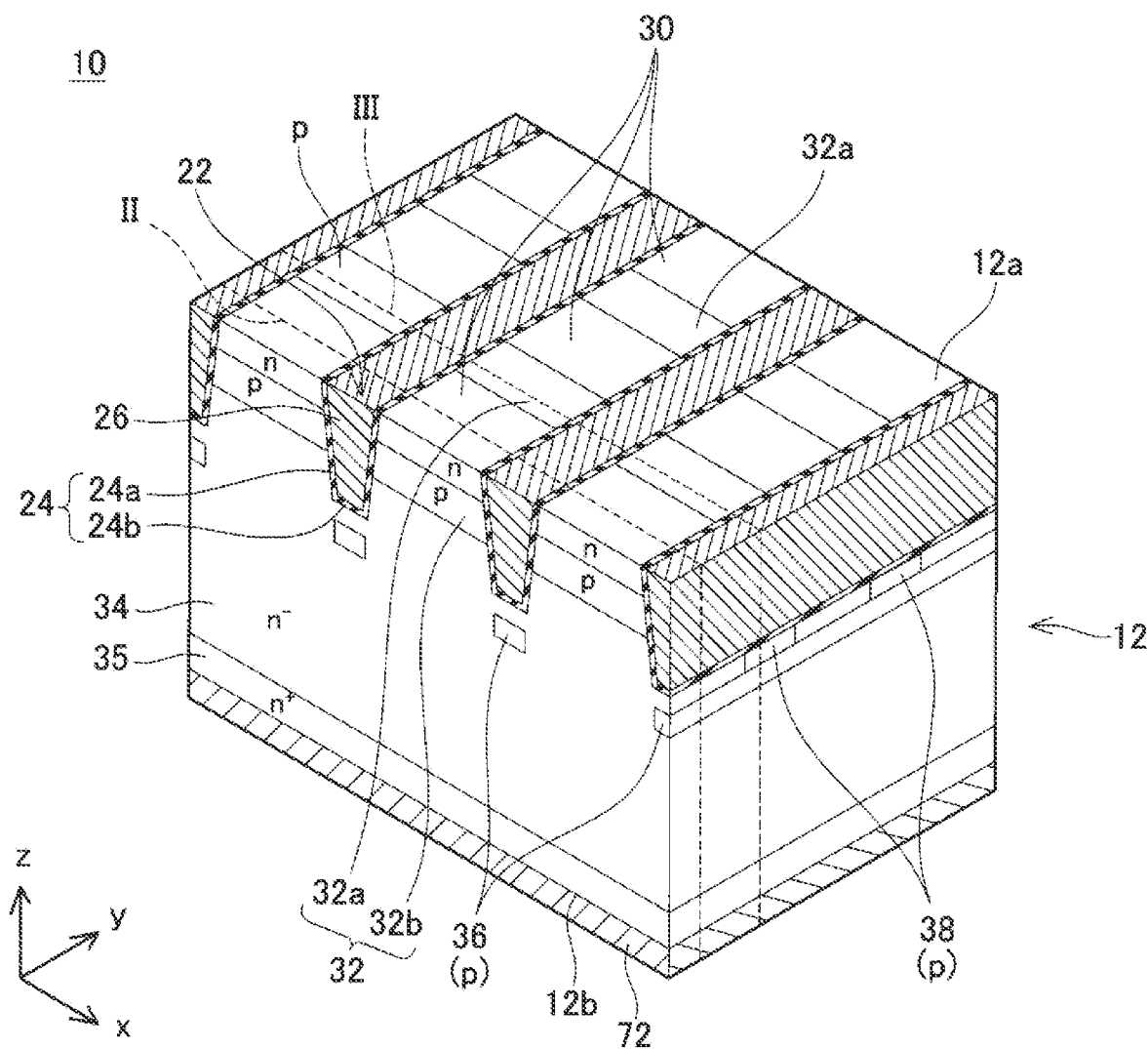
FIG. 1 is a perspective view including a cross-section of a MOSFET according to an embodiment.
Figure 2:
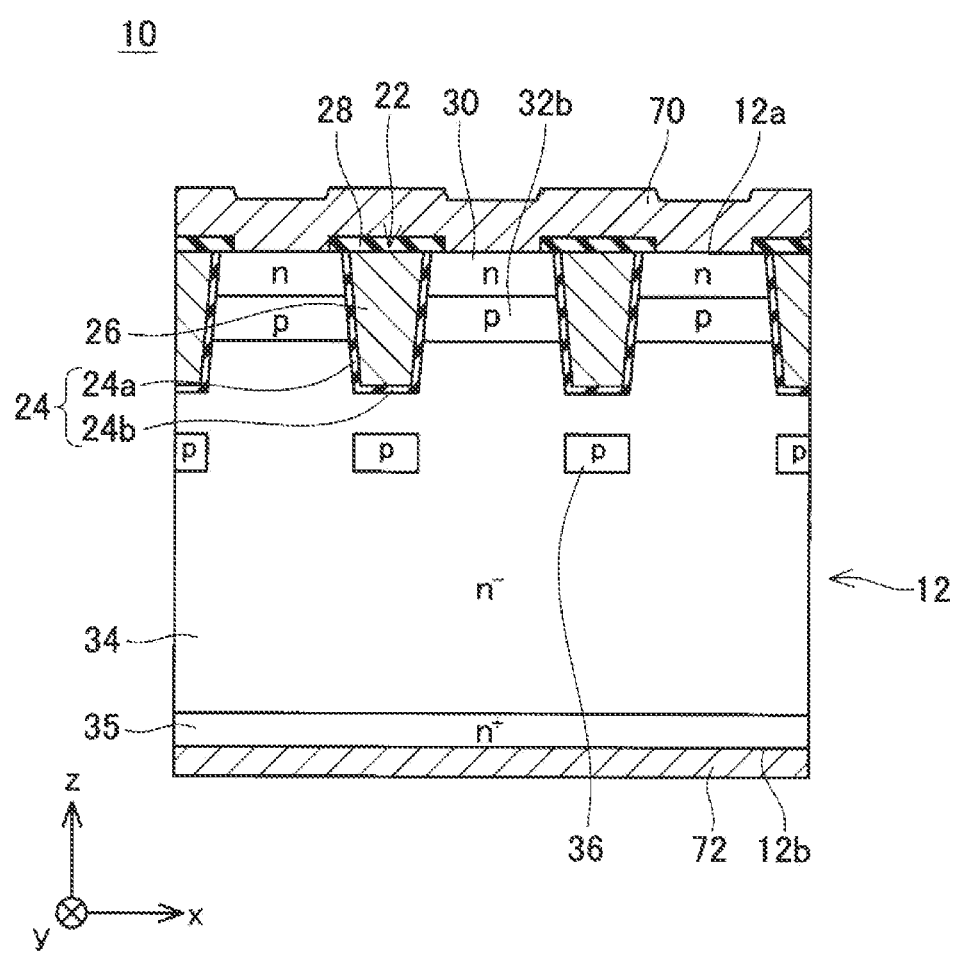
FIG. 2 is a cross-sectional view taken along a plane II in FIG. 1.
Figure 3:
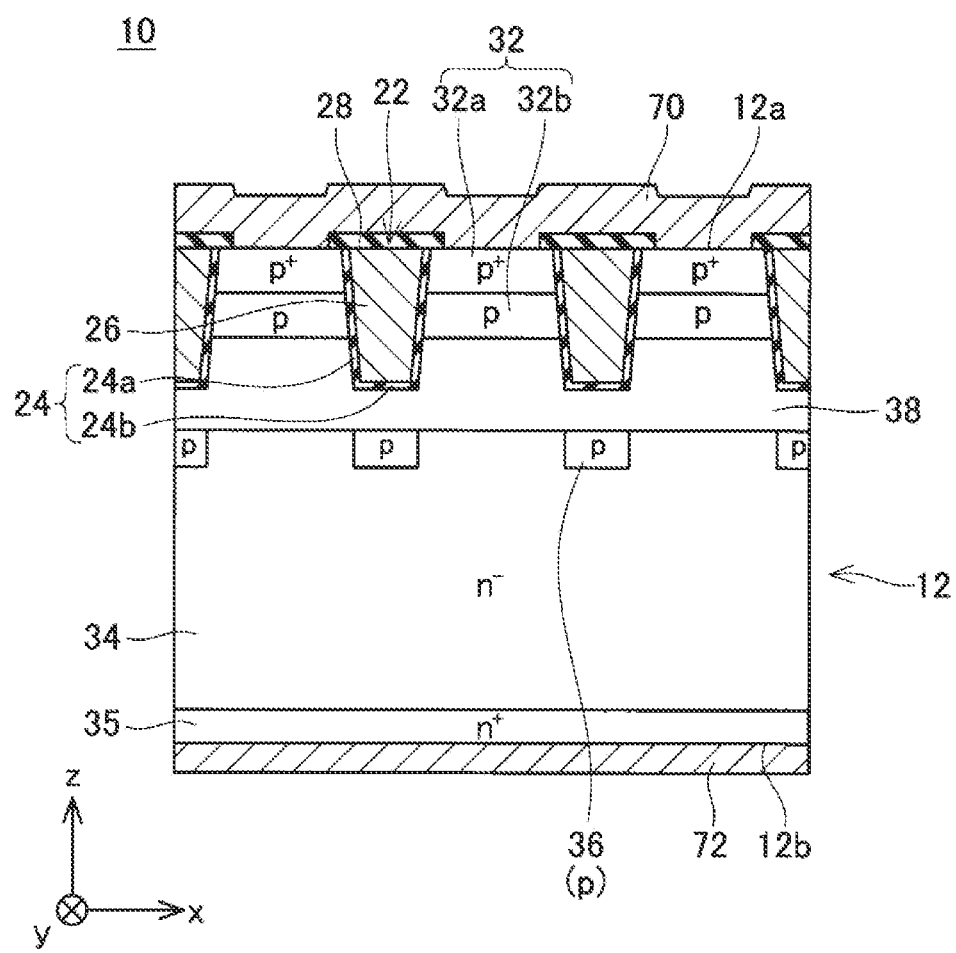
FIG. 3 is a cross-sectional view taken along a plane III in FIG. 1.

FIGS. 1 to 3 show a MOSFET (metal-oxide-semiconductor field effect transistor) 10 of the first embodiment. The MOSFET 10 has a semiconductor substrate 12. In the following, a direction parallel to an upper surface 12a of the semiconductor substrate 12 may also be referred to as an x-direction, a direction parallel to the upper surface 12a and perpendicular to the x-direction may also be referred to as an y-direction, and a thickness direction of the semiconductor substrate 12 may also be referred to as a z-direction. FIG. 2 is a cross-sectional view taken along the plane II of FIG. 1, and FIG. 3 is a cross-sectional view taken along the plane III of FIG. 1. As shown in FIGS. 2 and 3, electrodes, an insulating films, and the like are provided on the upper surface 12a of the semiconductor substrate 12. In FIG. 1, electrodes and the insulating films on the upper surface 12a of the semiconductor substrate 12 are not shown for explanation purposes.

The semiconductor substrate 12 is made of silicon carbide (SiC). A plurality of trenches 22 are disposed on the upper surface 12a of the semiconductor substrate 12. As illustrated in FIG. 1, the trenches 22 extend in parallel with each other on the upper surface 12a. The plurality of trenches 22 extend linearly in the y-direction on the upper surface 12a. The trenches 22 are arranged to be spaced away from each other at intervals in the x-direction. A gate insulating film 24 and a gate electrode 26 are arranged inside each of the plurality of trenches 22.

The gate insulating film 24 covers an inner surface of the trench 22. The gate insulating film 24 has a side insulating film 24a that covers the side surface of the trench 22 and a bottom insulating film 24b that covers the bottom surface of the trench 22. The gate insulating film 24 is made of silicon oxide.

The gate electrode 26 is arranged inside the trench 22. The gate electrode 26 is insulated from the semiconductor substrate 12 by the gate insulating film 24. As shown in FIGS. 2 and 3, an upper surface of the gate electrode 26 is covered with an interlayer insulating film 28.

As shown in FIGS. 2 and 3, a source electrode 70 is disposed on the upper surface 12a of the semiconductor substrate 12. The source electrode 70 covers the upper surface 12a and the interlayer insulating films 28. The source electrode 70 is in contact with the upper surface 12a of the semiconductor substrate 12 at portions where the interlayer insulating films 28 are not provided. The source electrode 70 is insulated from the gate electrodes 26 by the interlayer insulation films 28. A drain electrode 72 is arranged on a lower surface 12b of the semiconductor substrate 12. The drain electrode 72 is in contact with the lower surface 12b of the semiconductor substrate 12.

As shown in FIG. 1, a plurality of source regions 30, a body region 32, a plurality of bottom regions 36, a drift region 34, and a drain region 35 are provided inside the semiconductor substrate 12.

Each of the source regions 30 is an n-type region. As shown in FIGS. 1 and 2, the plurality of source regions 30 are arranged in each of the semiconductor regions (hereinafter, referred to as "inter-trench regions") interposed between the two adjacent trenches 22. As illustrated in FIG. 1, the plurality of source regions 30 are arranged at intervals in the y-direction in each of the inter-trench regions. As illustrated in FIG. 2, each of the source regions 30 is arranged at a region exposed to the upper surface 12a of the semiconductor substrate 12, and is in ohmic contact with the source electrode 70. Each source region 30 is in contact with two trenches 22 located on both sides of the inter-trench region. Each source region 30 is in contact with the side insulating films 24a at an upper side of the trench 22.

The body region 32 is a p-type region. The body region 32 has a plurality of body contact regions 32a and low concentration body regions 32b.

Each of the body contact regions 32a is a p-type region with a higher impurity concentration. As shown in FIG. 1, each body contact region 32a is provided in the inter-trench region. Each of the contact regions 32a is arranged in a region exposed to the upper surface 12a of the semiconductor substrate 12. The plurality of body contact regions 32a are arranged in each inter-trench region. In each inter-trench region, the source regions 30 and the body contact regions 32a are alternately arranged in the y-direction. Therefore, the body contact region 32a is arranged between the two source regions 30. As illustrated in FIG. 3, each of the body contact regions 32a is in ohmic contact with the source electrode 70.

Each of the low-concentration body regions 32b is a p-type region having a lower p-type impurity concentration than each body contact region 32a. As shown in FIGS. 1 to 3, the low-concentration body region 32b is arranged below each source region 30 and each body contact region 32a. The low-concentration body region 32b is in contact with each source region 30 and each body contact region 32a from a lower side thereof. The low-concentration body region 32b extends over the entire lower side area of the corresponding source region 30 or the corresponding body contact region 32a. As shown in FIG. 2, the low-concentration body region 32b is in contact with the side insulating films 24a at a lower side of the source region 30. The lower end of the low concentration body region 32b is located higher than the lower end of the gate electrode 26.

As shown in FIGS. 1 and 3, connection regions 38 extending downward from the low-concentration body regions 32b are provided at positions below the body contact regions 32a. Each connection region 38 extends downward to a position lower than the lower end of the trench 22. As shown in FIGS. 1 and 2, the connection regions 38 are not provided below the source regions 30. As shown in FIG. 1, similar to the body contact regions 32a, the connection regions 38 are arranged at intervals in the y-direction.

The drift region 34 is an n-type region having a low n-type impurity concentration. As shown in FIGS. 1 to 3, the drift region 34 is arranged below the body regions 32 (more specifically, the low concentration body regions 32b) and the connection regions 38. The drift region 34 is in contact with the low concentration body regions 32b and the connection regions 38. The drift region 34 is separated away from each source region 30 by the low concentration body regions 32b. The drift region 34 extends downward to a position lower than the low end of each of the trenches 22 from each of the inter-trench regions. The drift region 34 is in contact with the side insulating films 24a and the bottom insulating films 24b at positions that are lower than the low-concentration body region 32b except portions separated by the connection regions 38 from the films 24a and 24b. Below the low end of the connection regions 38, the drift region 34 extends over the substantially entire area of the semiconductor substrate 12 in the x-direction and the y-direction.

The drain region 35 is an n-type region with a higher n-type impurity concentration than the drift region 34. As illustrated in FIGS. 1 to 3, the drain region 35 is arranged below the drift region 34. The drain region 35 is in contact with the drift region 34 from a lower side. The drain region 35 is provided to be exposed to the lower surface 12b of the semiconductor substrate 12 and is in ohmic contact with the drain electrode 72.

As shown in FIGS. 1 to 3, each bottom region 36 is located under the corresponding trench 22. Each bottom region 36 is located away from the bottom surface of the corresponding trench 22. That is, each bottom region 36 is disposed at a position spaced away from the corresponding bottom insulating film 24b. In other words, a space is formed between the bottom insulating film 24b and the bottom region 36. As shown in FIG. 1, the bottom region 36 extends along the bottom surface of the trench 22 in the y-direction. In the cross-sectional view of FIG. 2, each of the bottom regions 36 is surrounded by the drift region 34. Therefore, the drift region 34 is arranged in a gap between the bottom insulating films 24b and the bottom regions 36. The drift region 34 is in contact with the bottom insulating films 24b above the bottom regions 36. In the cross-sectional view of FIG. 2, the bottom region 36 is in contact with the drift region 34 over its upper surface, side surfaces, and lower surface. In the cross-sectional view of FIG. 3, each bottom region 36 is connected to the lower end of the connection region 38. As described above, the upper end of the connection region 38 is connected to the low concentration body regions 32b. Therefore, each bottom region 36 is connected to the low concentration body regions 32b via the connection region 38. Thus, each bottom region 36 is connected to the source electrode 70 via the connection region 38, the low concentration body regions 32b, and the body contact regions 32a. Therefore, potential of the bottom region 36 is substantially equal to the potential of the source electrode 70.

Figure 4:
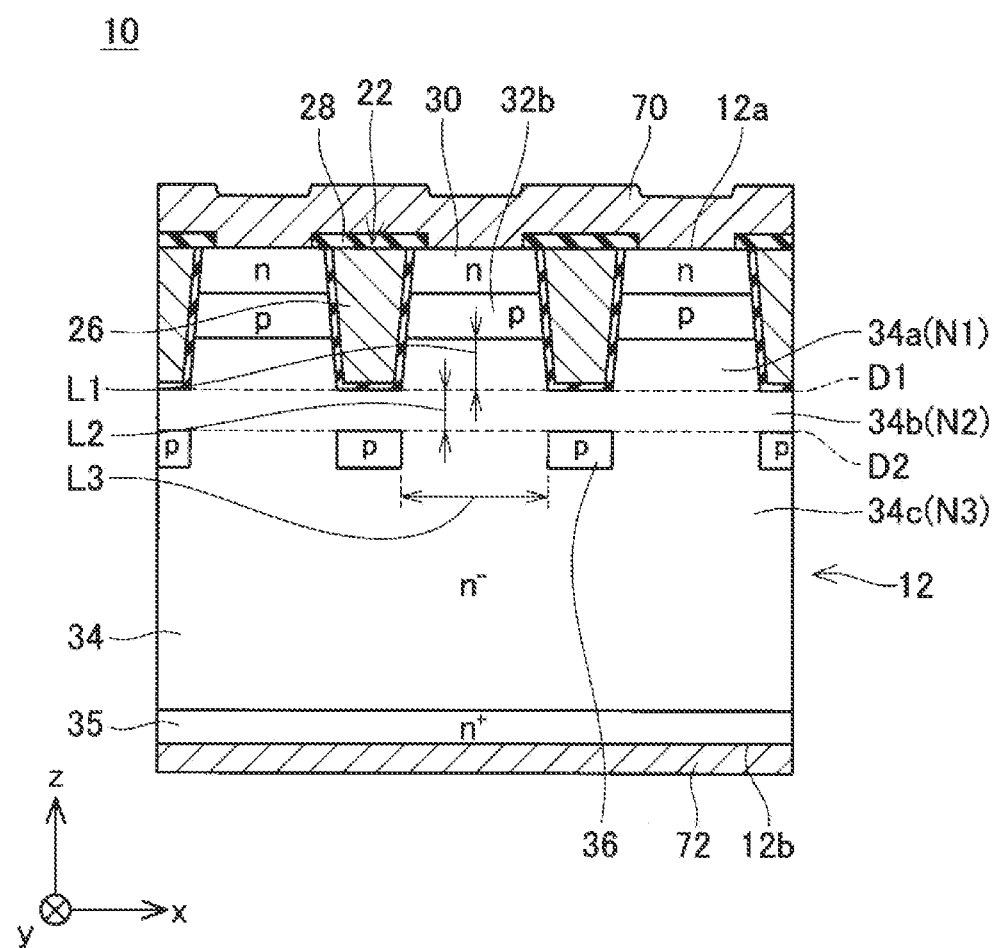
FIG. 4 is a diagram showing a divided drift region.

FIG. 4 shows a diagram in which the drift region 34 is divided into a plurality of part regions arranged in the z-direction. In FIG. 4, the drift region 34 is divided into an upper drift region 34a, a middle drift region 34b, and a lower drift region 34c. The upper drift region 34a is an upper portion of the drift region 34 above the position at a depth level D1 of the lower end of each trench 22 (that is, within the range between the lower end of each trench 22 and the body region 32). The middle drift region 34b is an intermediate portion of the drift region 34 within a range between the position at the depth level D1 of the lower end of each trench 22 and the position at a depth level D2 of the upper end of each bottom region 36. The lower drift region 34c is a lower portion of the drift region 34 below the depth level D2 of the upper end of each bottom region 36 (i.e., within a range between the depth level D2 of the upper end of each bottom region 36 and the drain region 35). Hereinafter, the concentration of n-type impurities in the upper drift region 34*a* is referred to as concentration N1, the concentration of n-type impurities in the middle drift region 34*b* is referred to as concentration N2, and the concentration of n-type impurities in the lower drift region 34*c* is referred to as concentration N3. Further, in the following, the thickness of the upper drift region 34*a* (i.e., a distance between the depth level D1 of the lower end of each trench 22 and the body region 32) is referred to as a distance L1, and the thickness of the middle drift region 34*b* (i.e., a distance between the depth level D1 of the lower end of each trench 22 and the depth level D2 of the upper end of each bottom region 36) is referred to as a distance L2. Further, the distance between the adjacent bottom regions 36 (i.e., the distance in the x-direction) is referred to as a distance L3.

In the first embodiment, N1=N2=N3. Further, in the first embodiment, the relationships of L1<L3/2, L2<L3/2, and L2<L1 are satisfied.

Next, the operation of the MOSFET 10 according to the first embodiment will be described. When the MOSFET 10 is used, the MOSFET 10 is connected in series with a load (for example, a motor) and a power supply. A power supply voltage is applied to the series circuit of the MOSFET 10 and the load. A power supply voltage is applied to the MOSFET 10 in a direction to cause the drain electrode 72 to have a higher voltage than the source electrode 70. When a voltage equal to or higher than a gate threshold value is applied to the gate electrode 26, a channel is formed in a region of the body region 32 that is in contact with the gate insulating film 24, and then the MOSFET 10 is turned on. During the MOSFET being on, a depletion layer does not extend in the drift region 34. When the voltage applied to the gate electrode 26 is lowered to be less than the gate threshold value, the MOSFET 10 is turned off.

Figure 5:
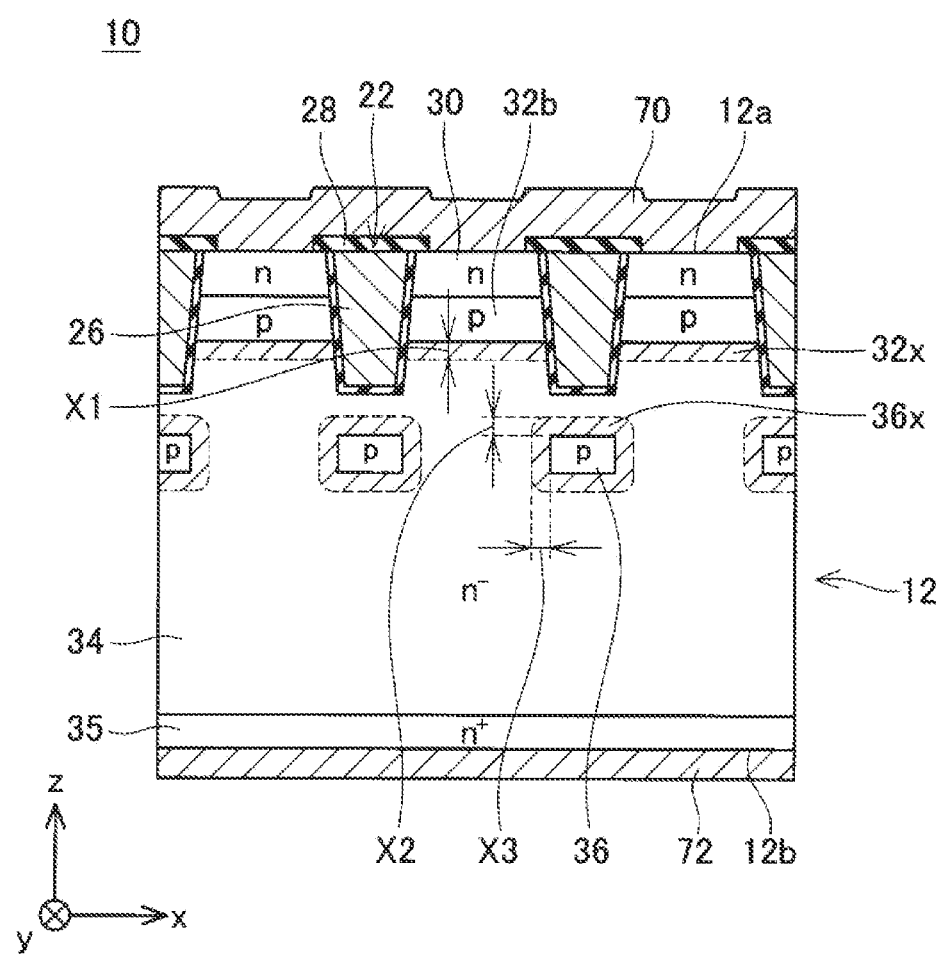
FIG. 5 is a cross-sectional view showing a depletion layer that is extending.

When the MOSFET 10 is turned off, the potential of the drain electrode 72 increases. The drift region 34 is connected to the drain electrode 72 via the drain region 35. The body regions 32 are connected to the source electrode 70. Further, the bottom regions 36 are connected to the body regions 32 via the connection region 38. Therefore, the potential of the bottom regions 36 is substantially equal to the potential of the body regions 32 (that is, the potential of the source electrode 70). Therefore, when the potential of the drain electrode 72 increases relative to the potential of the source electrode 70, reverse voltage is applied to each of the pn junction at the interface between the body region 32 and the drift region 34 and the pn junction at the interface between the bottom region 36 and the drift region 34. Therefore, the depletion layer spreads in the drift region 34 from these pn junctions. That is, as shown in FIG. 5, the depletion layers 32*x* spreads from the body regions 32 into the drift region 34, and the depletion layer 36*x* spreads from each bottom region 36 into the drift region 34. As the potential of the drain electrode 72 increases, the depletion layers 32*x* and 36*x* expand.

The extending distance X1 of the depletion layer 32*x* extending from the body region 32 has a relationship of the following formula 4. Further, the extending distance X2 of the depletion layer 36*x* extending upward from the bottom region 36 has a relationship of the following formula 5. Further, the extending distance X3 of the depletion layer 36*x* extending laterally from the bottom region 36 has a relationship of the following formula 6.

$$X1 = \sqrt{\frac{2\varepsilon(Vds + \varphi)}{qN1}}$$ (Formula 4)

$$X2 = \sqrt{\frac{2\varepsilon(Vds + \varphi)}{qN2}}$$ (Formula 5)

$$X3 = \sqrt{\frac{2\varepsilon(Vds + \varphi)}{qN3}}$$ (Formula 6)

In the formulas 4 to 6, $\varepsilon$ is the permittivity of the drift region 34, Vds is voltage applied between the drain electrode 72 and the source electrode 70, $\varphi$ is the built-in potential of the pn junction, and q is an elementary charge. As is clear from the formulas 4 to 6, the extending distances X1 to X3 satisfy the relationship of the following formulas 7 to 9.

$$X1\sqrt{N1} = X2\sqrt{N2}$$ (Formula 7)

$$X1\sqrt{N1} = X3\sqrt{N3}$$ (Formula 8)

$$X2\sqrt{N2} = X3\sqrt{N3}$$ (Formula 9)

As described above, in the first embodiment, since N1=N2=N3, X1=X2=X3.

Figure 6:
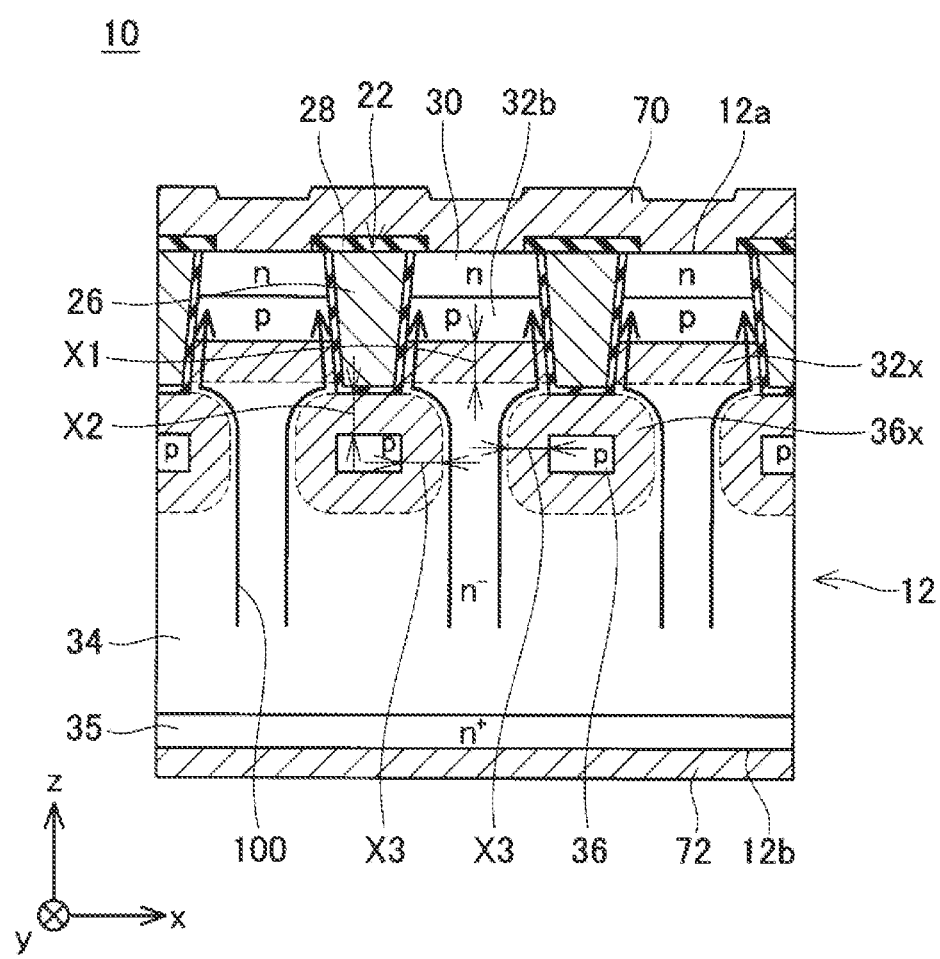
FIG. 6 is a cross-sectional view showing the depletion layer that is further extending.

As described above, when the MOSFET 10 is turned off, the voltage Vds increases. As the voltage Vds increases, the extending distances X1, X2, and X3 increase. That is, as the voltage Vds increases, the depletion layers 32*x* and 36*x* expand. When the voltage Vds increases to a certain value, the extending distances X1, X2, and X3 reach to be equal to the distance L2. At this stage, as shown in FIG. 6, each depletion layer 36*x* is in contact with the bottom surface of the corresponding trench 22 (that is, the bottom insulating film 24*b*). By covering the bottom surface of the trench 22 with the depletion layer 36*x* in this way, concentration of the electric field on the gate insulating film 24 at the lower end of the trench 22 can be prevented. As a result, deterioration of the gate insulating film 24 is suppressed.

Figure 7:
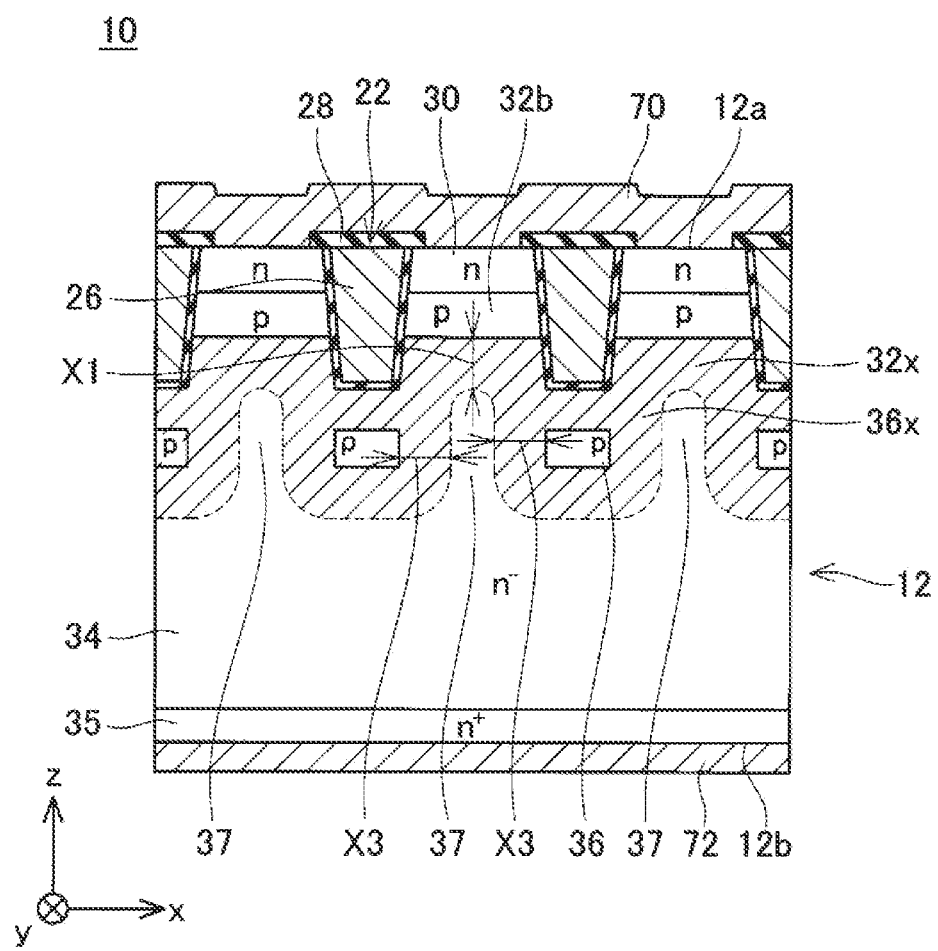
FIG. 7 is a cross-sectional view showing the depletion layer that is further extending.

Further, since L2<L1 as shown in FIG. 4, the extending distance X1 of the depletion layer 32*x* at the moment shown in FIG. 6 has not reached to be equal to the distance L1. That is, as shown in FIG. 6, the depletion layer 32*x* does not reach the lower end of the trench 22. Therefore, the depletion layer 32*x* is not connected to the depletion layer 36*x*. In this state, since the electron storage layer exists in a region around the gate insulating film 24 in the depletion layer 32*x*, electrons flow along the path indicated by the arrow 100. In this way, electrons flow through the MOSFET 10 even when the depletion layer expands to some extent. After that, when the extending distances X1, X2, and X3 further increase and reach the distance L1, the depletion layer 32*x* and the depletion layer 36*x* are connected to each other as shown in FIG. 7. At this stage, the electron path 100 (see FIG. 6) is cut off and the current stops. Therefore, it is possible to allow a current flows with low loss until the path 100 is cut off, and it is possible to immediately stop the current at the timing the path 100 is cut off. In this way, by satisfying L2<L1, the MOSFET 10 can operate with low loss.

Further, as shown in FIG. 4, the distance L3 between adjacent bottom regions 36 satisfies the relationship of L1<L3/2 and L2<L3/2. Therefore, as shown in FIG. 6, when the extending distances X1, X2, and X3 reach the distance L1, the depletion layers 36*x* are not connected to each other between the adjacent bottom regions 36. That is, a non-depletion region 37 remains between the depletion layers 36x extending from the adjacent bottom regions 36. In this way, each depletion layer 36x is connected to the depletion layer 32x before the depletion layers 36x are connected to each other. Therefore, a non-depleted region in a floating state such as a non-depleted region 924 illustrated in FIG. 9 as a comparative example is not formed in the MOSFET 10 according to the first embodiment. As a result, concentration of the electric field on the gate insulating film 24 around the lower end of the trench 22 can be prevented. Further, if the floating non-depleted region is formed as shown in FIG. 9, capacitance (that is, feedback capacitance) between the gate electrode 26 and the drift region 34 would increase, and thus the switching speed would decrease. In the MOSFET 10 of the first embodiment, however, since the non-depleted region in the floating state is not formed, the feedback capacitance is low and high-speed switching can be realized.

Figure 8:
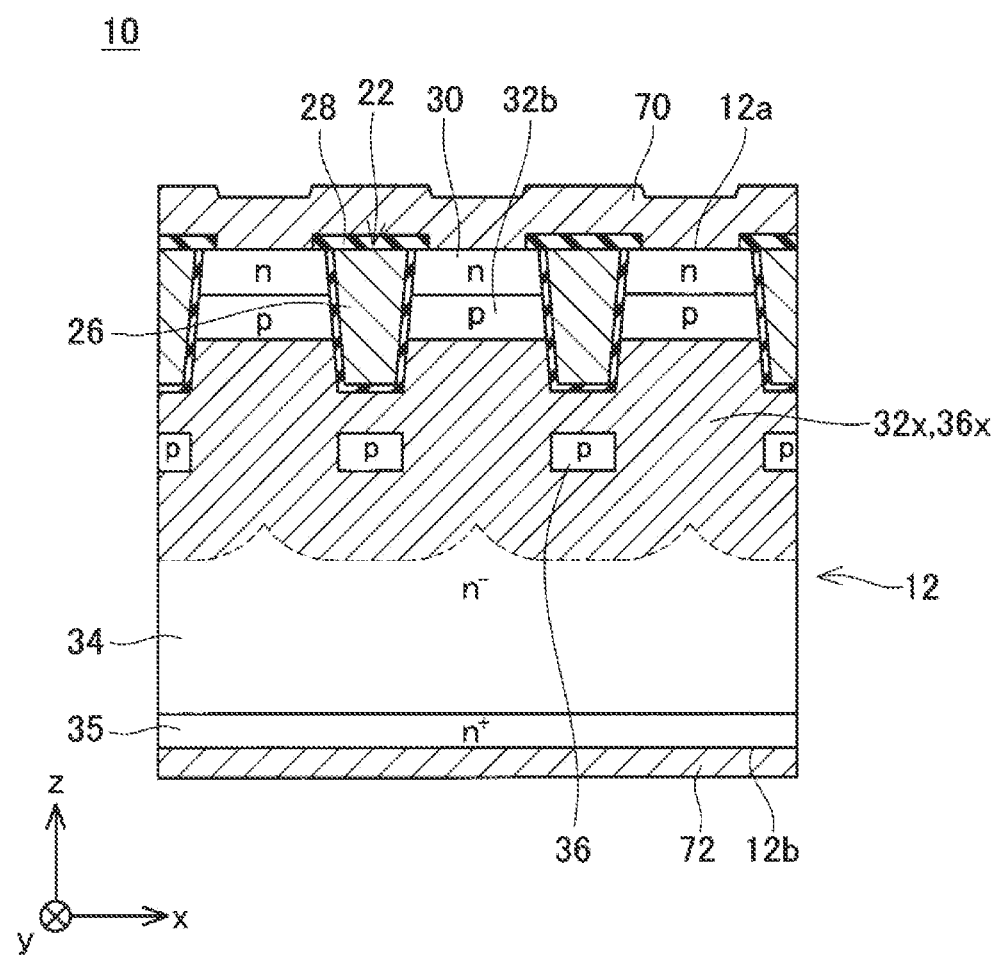
FIG. 8 is a cross-sectional view showing the depletion layer that is further extending.

After that, when the voltage Vds further increases, the depletion layers 36x extending from the adjacent bottom regions 36 are connected to each other as shown in FIG. 8. After that, when the voltage Vds further increases, the depletion layer spreads entirely across the drift region 34. This completes turning-off of the MOSFET 10.

As described above, in the MOSFET 10 according to the first embodiment, it is possible to prevent the floating non-depleted region from being formed in the drift region 34 during the process of switching from an on-state to an off-state. Therefore, deterioration of the gate insulating film can be prevented, and the feedback capacitance can be reduced.

Second Embodiment

In the second embodiment, the relationship between the concentrations N1, N2, N3, and the distances L1, L2, and L3 are different from those in the first embodiment. In the second embodiment, N3=N2<N1. Further, in the second embodiment, the following mathematical formulas 10 to 12 are satisfied.

$$L1\sqrt{N1} < \frac{L3}{2}\sqrt{N3} \quad \text{(Formula 10)}$$

$$L2\sqrt{N2} < \frac{L3}{2}\sqrt{N3} \quad \text{(Formula 11)}$$

$$L2\sqrt{N2} < L1\sqrt{N1} \quad \text{(Formula 12)}$$

In the second embodiment, L2>L1 is satisfied while satisfying the formulas 10 to 12. Alternatively, however, L2=L1 or L2<L1 may be satisfied.

When the MOSFET 10 of the second embodiment is turned off, the depletion layers 32x and 36x expand as the voltage Vds increases, as with the first embodiment. When the extending distance X2 of the depletion layer 36x reaches the distance L2, the depletion layer 36x comes into contact with the bottom surface of the trench 22 as with FIG. 6. As a result, deterioration of the gate insulating film 24 is suppressed. Further, at this stage, the extending distance X1 of the depletion layer 32x satisfies the relationship of X1=L2 (N2/N1)$^{1/2}$ from the relationship of the above formula 7 and X2=L2. From this relationship and the above formula 12, the relationship of X1<L1 is satisfied. That is, at this stage, the depletion layer 32x does not reach the lower end of the trench 22, as with FIG. 6. Therefore, at this stage, electrons can flow in the same path as the arrow 100 shown in FIG. 6. After that, when the extending distance X1 of the depletion layer 32x reaches the distance L1, the depletion layer 32x and the depletion layer 36x are connected to each other as with FIG. 7. At this time, the extending distance X3 of the depletion layer 32x satisfies the relationship of X3=L1 (N1/N3)$^{1/2}$ from the above formula 8 and the relationship of X1=L1. From this relationship and the above formula 10, the relationship of X3<L3/2 is satisfied. That is, at this stage, as with FIG. 7, a non-depleted region 37 exists between the depleted layers 32x extending from the adjacent bottom regions 36. Therefore, a floating non-depleted region is not formed in the drift region 34. As a result, concentration of the electric field on the gate insulating film 24 around the lower end of the trench 22 can be prevented. Also, the feedback capacitance can be reduced. Thereafter, the depletion layer spreads entirely over the drift region 34 as the voltage Vds increases. This completes turning-off of the MOSFET 10.

As described above, in the MOSFET according to the second embodiment, it is possible to prevent the floating non-depleted region from being formed in the drift region 34 during the process of switching from an on-state to an off-state. Therefore, deterioration of the gate insulating film can be prevented, and the feedback capacitance can be reduced.

In the second embodiment, the concentration N1 is greater than the concentration N2 and the concentration N3. Therefore, the depletion layer 32x extends at a relatively low speed in the upper drift region 34a. Therefore, the electron path indicated by the arrow 100 can be secured for a longer time. This further contributes to a reduction in the loss caused by the MOSFET. Further, since the concentration N2 and the concentration N3 are lower than the concentration N1, the depletion layer can rapidly extend in the middle drift region 34b and the lower drift region 34c. Therefore, the current can be immediately stopped after the electron path is cut off.

In the first and second embodiments, N2=N3, but N2 and N3 may be different from each other. Further, in the first and second embodiments described above, although the above formula 12 is satisfied, the formula 12 may not be satisfied. Even in this case, as long as the formulas 10 and 11 are satisfied, it is possible to prevent the floating non-depleted region from forming.

Further, although MOSFET has been described in the first and second embodiments, the technique disclosed in the present disclosure may be applied to other switching elements such as IGBTs (insulated gate bipolar transistors). When an IGBT is used as the switching element, the source region may be referred to as an emitter region.

Further, in the first and second embodiments, each of the connection regions 38 is connected to the plurality of bottom regions 36, but the connection region 38 may be provided by dividing the connection region 38 for each bottom region 36.

Further, in the first and second embodiments, the concentration N2 and the concentration N3 are equal to each other, but the concentration N2 and the concentration N3 may be different from each other.

Although the embodiments have been described in detail above, these are merely examples and do not limit the scope of claims. The techniques described in claims include various modifications of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings achieve a plurality of objectives at the same time, and achieving one of the objectives itself has technical usefulness.

The invention claimed is:
1. A switching element, comprising:
a semiconductor substrate;
a plurality of trenches provided on an upper surface of the semiconductor substrate;
a plurality of gate insulating films each of which covers an inner surface of a corresponding one of the plurality of trenches; and
a plurality of gate electrodes each of which is disposed inside a corresponding one of the plurality of trenches, each of the plurality of gate electrodes being insulated from the semiconductor substrate by a corresponding one of the plurality of gate insulating films, wherein
the semiconductor substrate includes:
an n-type drift region in contact with each of the plurality of gate insulating films on a bottom surface and side surfaces of each of the plurality of trenches;
a p-type body region in contact with the plurality of gate insulating films on the side surfaces of each of the plurality of trenches at a position above the n-type drift region;
an n-type source region in contact with the plurality of gate insulating films on the side surfaces of each of the plurality of trenches at a position above the p-type body region, the n-type source region being separated away from the n-type drift region by the p-type body region;
a plurality of p-type bottom regions each of which is located under a corresponding one of the plurality of trenches and located away from a corresponding one of the plurality of gate insulating films; and
a p-type connection region that connects the plurality of p-type bottom regions and the p-type body region,
a distance between a lower end of each of the plurality of trenches and the p-type body region is defined as a distance $L1$,
a concentration of n-type impurities in the n-type drift region in a range between the lower end of each of the plurality of trenches and the p-type body region is defined as a concentration $N1$,
a distance between the lower end of each of the plurality of trenches and an upper end of each of the plurality of p-type bottom regions is defined as a distance $L2$,
a concentration of n-type impurities in the n-type drift region in a range between the lower end of each of the plurality of trenches and the upper end of each of the plurality of p-type bottom regions is defined as a concentration $N2$,
a distance between adjacent ones of the plurality of p-type bottom regions is defined as a distance $L3$,
a concentration of n-type impurities in the n-type drift region in a range between the adjacent ones of the plurality of p-type bottom regions is defined as a concentration $N3$, wherein

$$L1\sqrt{N1} < \frac{L3}{2}\sqrt{N3} \quad \text{(Formula 1)}$$

and $$L2\sqrt{N2} < \frac{L3}{2}\sqrt{N3}. \quad \text{(Formula 2)}$$

2. The switching element according to claim 1, wherein $$L2\sqrt{N2} < L1\sqrt{N1}. \quad \text{(Formula 3)}$$

3. The switching element according to claim 1, wherein $N2<N1$.

* * * * *